(12) United States Patent
Kolhatkar et al.

(10) Patent No.: US 9,660,439 B2
(45) Date of Patent: May 23, 2017

(54) DIRECT CURRENT POWER DISTRIBUTION AND PROTECTION SYSTEM

(71) Applicant: General Electric Company, Schenectady, NY (US)

(72) Inventors: Yashomani Y. Kolhatkar, Karnataka (IN); Rajendra Naik, Karnataka (IN); Viswanathan Kanakasabai, Karnataka (IN); Raghothama Reddy, Plano, TX (US)

(73) Assignee: General Electric Company, Niskayuna, NY (US)

( * ) Notice: Subject to any disclaimer, the term of this patent is extended or adjusted under 35 U.S.C. 154(b) by 194 days.

(21) Appl. No.: 14/732,220

(22) Filed: Jun. 5, 2015

(65) Prior Publication Data

US 2016/0359319 A1 Dec. 8, 2016

(51) Int. Cl.
| | | |
|---|---|---|
| *H02J 1/00* | (2006.01) | |
| *H02H 9/02* | (2006.01) | |
| *H02H 7/26* | (2006.01) | |
| *H02J 1/10* | (2006.01) | |
| *G01R 31/08* | (2006.01) | |

(52) U.S. Cl.
CPC ............ *H02H 9/02* (2013.01); *H02H 7/268* (2013.01); *H02J 1/00* (2013.01); *H02J 1/10* (2013.01); *G01R 31/086* (2013.01)

(58) Field of Classification Search
CPC .............. H02J 1/00; H02J 1/10; G01R 3/086
USPC .......................................................... 307/43
See application file for complete search history.

(56) References Cited

U.S. PATENT DOCUMENTS

| | | |
|---|---|---|
| 5,319,536 A | 6/1994 | Malik |
| 7,557,464 B2 | 7/2009 | Wang et al. |
| 8,803,358 B2 | 8/2014 | Haefner et al. |
| 2005/0146814 A1 | 7/2005 | Sellier et al. |
| 2011/0187197 A1 | 8/2011 | Moth |
| 2012/0161518 A1 | 6/2012 | Schroeder et al. |
| 2013/0077204 A1 | 3/2013 | Berggren et al. |
| 2013/0270902 A1 | 10/2013 | Andersen et al. |
| 2013/0286521 A1 | 10/2013 | Park |

FOREIGN PATENT DOCUMENTS

| | | |
|---|---|---|
| CN | 102025155 A | 4/2011 |
| CN | 102916481 A | 2/2013 |
| CN | 103236794 A | 8/2013 |
| CN | 103248066 A | 8/2013 |
| CN | 103346571 A | 10/2013 |
| CN | 103731062 A | 4/2014 |
| EP | 1538645 A1 | 6/2005 |
| EP | 2091123 A2 | 8/2009 |

(Continued)

OTHER PUBLICATIONS

Park et al.; "DC Ring-Bus Microgrid Fault Protection and Identification of Fault Location"; IEEE Transactions on Power Delivery, vol. 28, No. 4, Oct. 2013; pp. 2574-2584.

(Continued)

*Primary Examiner* — Robert Deberadinis
(74) *Attorney, Agent, or Firm* — Nitin N. Joshi

(57) ABSTRACT

A direct current power (DC) distribution system includes a plurality of DC power sources, a ring bus, a plurality of switch assemblies, and a plurality of passive protection assemblies. Each DC power source is coupled to the ring bus by a respective switch assembly and a respective passive protection assembly.

20 Claims, 3 Drawing Sheets

(56) References Cited

FOREIGN PATENT DOCUMENTS

KR        101417669 B1    7/2014
WO     2012123015 A1    9/2012

OTHER PUBLICATIONS

S.Vimalraj et al.; "Fault Detection, Isolation and Identification of Fault Location in Low-Voltage Dc Ring Bus Microgrid System"; International Journal of Advanced Research in Electrical, Electronics and Instrumentation Engineering, vol. 3, Special Issue 2, Apr. 2014; pp. 570-582.

Johnson et al., "An industrial power distribution system featuring UPS properties", Power Electronics Specialists Conference, PESC '93 Record, 24th Annual IEEE, pp. 759-765, Seattle, WA, Jun. 20-24, 1993.

Choudhary et al., "Fault Tolerant Circuit Topology and Control Method for Input-Series and Output-Parallel Modular DC-DC Converters", Power Electronics, IEEE, vol. No. 23, Issue No. 1, pp. 402-411, Jan. 2008.

European Search Report and Written Opinion issued in connection with corresponding EP Application No. 16172122.0 on Oct. 11, 2016.

DIRECT CURRENT POWER DISTRIBUTION AND PROTECTION SYSTEM

BACKGROUND

The field of the disclosure relates generally to electrical power distribution systems and, more particularly, to direct current (DC) distribution systems and DC protection systems.

Some known power distributions systems supply DC power to one or more loads. The loads include, for example, and without limitation, a DC load, an alternating current (AC) load, or a combination of AC and DC loads. Power distribution systems use various protection devices to protect equipment and people in the event of a fault. Protection devices include, for example, and without limitation, circuit breakers and fuses. Generally, when a fault occurs, power is disconnected from the load until the fault is cleared.

Some known DC power distribution systems have critical loads that cannot tolerate losses of power. DC power distribution systems are designed to be as robust and reliable as can be reasonably achieved for a given installation, which varies with, for example, and without limitation, cost, size, weight, and capacity. One challenge in providing reliable quality power is the availability of the power source. When a fault occurs, a power source is often removed from service, resulting in a loss of power. To overcome the availability problem, DC power distribution systems are designed for multiple DC power sources, presenting further challenges regarding isolation of faults.

BRIEF DESCRIPTION

In one aspect, a direct current power distribution system is provided. A direct current power (DC) distribution system includes a plurality of DC power sources, a ring bus, a plurality of switch assemblies, and a plurality of passive protection assemblies. Each DC power source is coupled to the ring bus by a respective switch assembly and a respective passive protection assembly.

In another aspect, a protection system for connection between a direct current power source and a direct current ring bus is provided. The protection system includes a passive protection assembly having a first, second, and third branch. The first branch has a first end and a second end. The first branch includes an inductor coupled between the first end and the second end. The second branch has a first end and a second end. The second branch includes a diode in series with a resistance coupled between the first end and the second end. The third branch has a first end and a second end. The third branch includes a diode in series with a resistance coupled between the first end and the second end. The first branch, second branch, and third branch first ends are coupled together and the first branch, second branch, and third branch second ends are coupled together.

In yet another aspect, a direct current power distribution system is provided. The direct current power distribution system includes a first distribution bus, a second distribution bus, and a ring bus connecting the first distribution bus and the second distribution bus. The first distribution bus is configured to provide direct current power and includes a first switch assembly and a first passive protection assembly. The second distribution bus is configured to provide direct current power and includes a second switch assembly and a second passive protection assembly.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, a number of terms are referenced that have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of the present disclosure relate to electrical power distribution systems. The direct current (DC) power distribution systems described herein facilitate power sharing among multiple energy sources and, more specifically, a DC ring bus architecture with improved fault isolation. DC protection systems described herein provide passive component fault protection that provides greater reliability to the DC power distribution system as a whole. More specifically, the DC protection systems utilize semiconductor switches and passive components in combination to limit current and reduce high-voltage stress on the circuit. The improved power availability and reliability of the DC ring bus and DC protection systems reduce life-cycle costs of the DC power distribution system.

Figure 1:
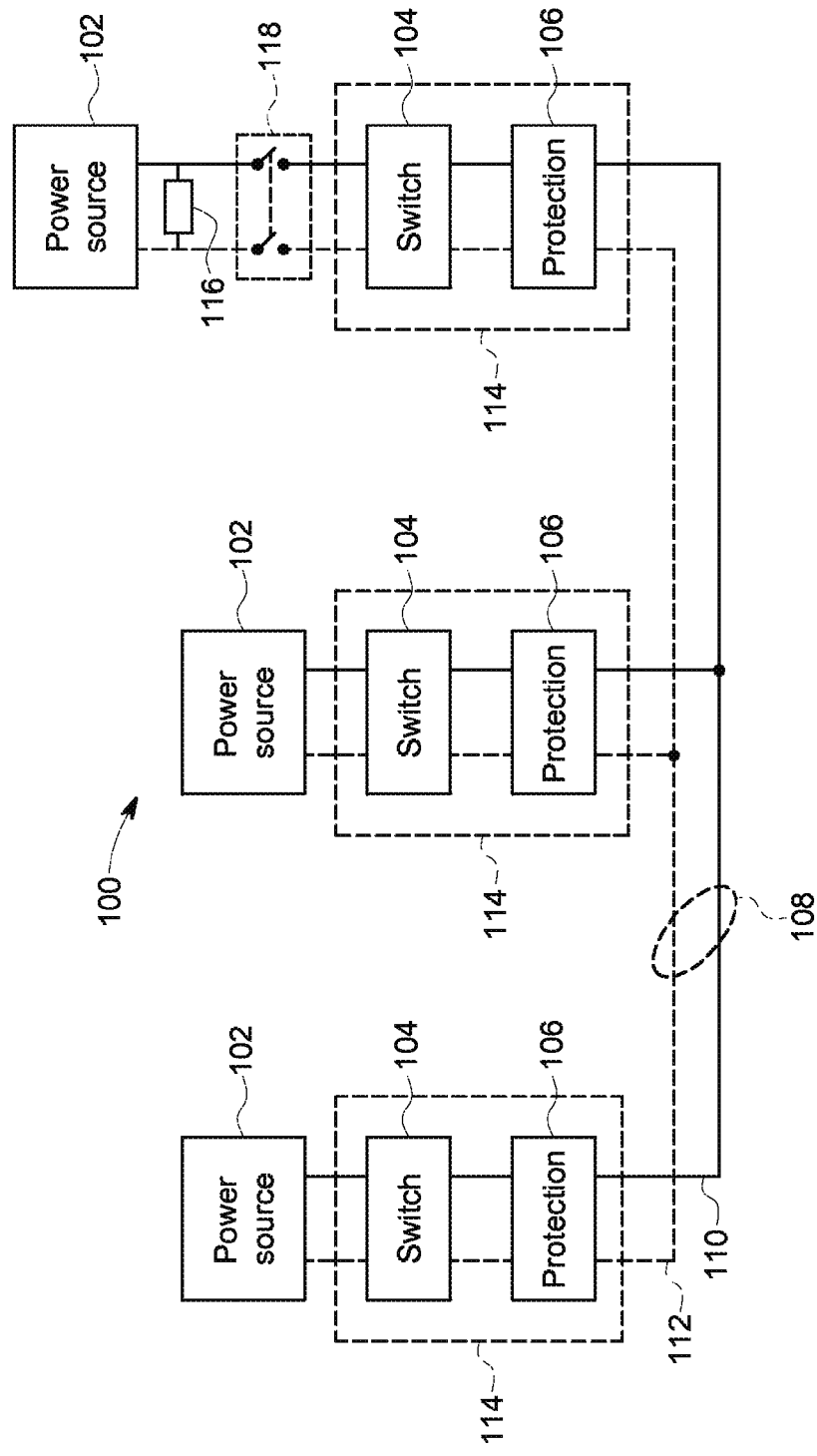
FIG. 1 is a block diagram of an exemplary DC power distribution system.

FIG. 1 is a diagram of an exemplary DC power distribution system 100. DC power distribution system 100 includes multiple power sources 102 coupled through switch assemblies 104 and protection assemblies 106 to a DC ring bus 108. DC ring bus 108 includes a positive DC bus 110 and a negative DC bus 112. For each of power sources 102, switch assembly 104 and protection assembly 106 combine to define a protection tie 114.

In certain embodiments, DC power distribution system 100 further includes a load 116 coupled to DC ring bus 108 between one of power sources 102 and a corresponding protection tie 114. In the event of a fault at one of power sources 102 or near load 116, the corresponding protection tie 114 isolates the fault from DC ring bus 108. In certain embodiments, further isolation is provided by a circuit breaker 118. By isolating the fault, the other two of power sources 102 continue supplying power and compensate for the lost power production of power source 102 on which the fault occurred.

In certain embodiments, switch assemblies 104 include semiconductor switches, such as, for example, and without limitation, insulated gate bipolar transistors (IGBTs) and metal-oxide semiconductor field effect transistors (MOSFETs). In other embodiments, switch assemblies 104 include mechanical switches, such as, for example, and without limitation, an electromechanical relay.

Figure 2:
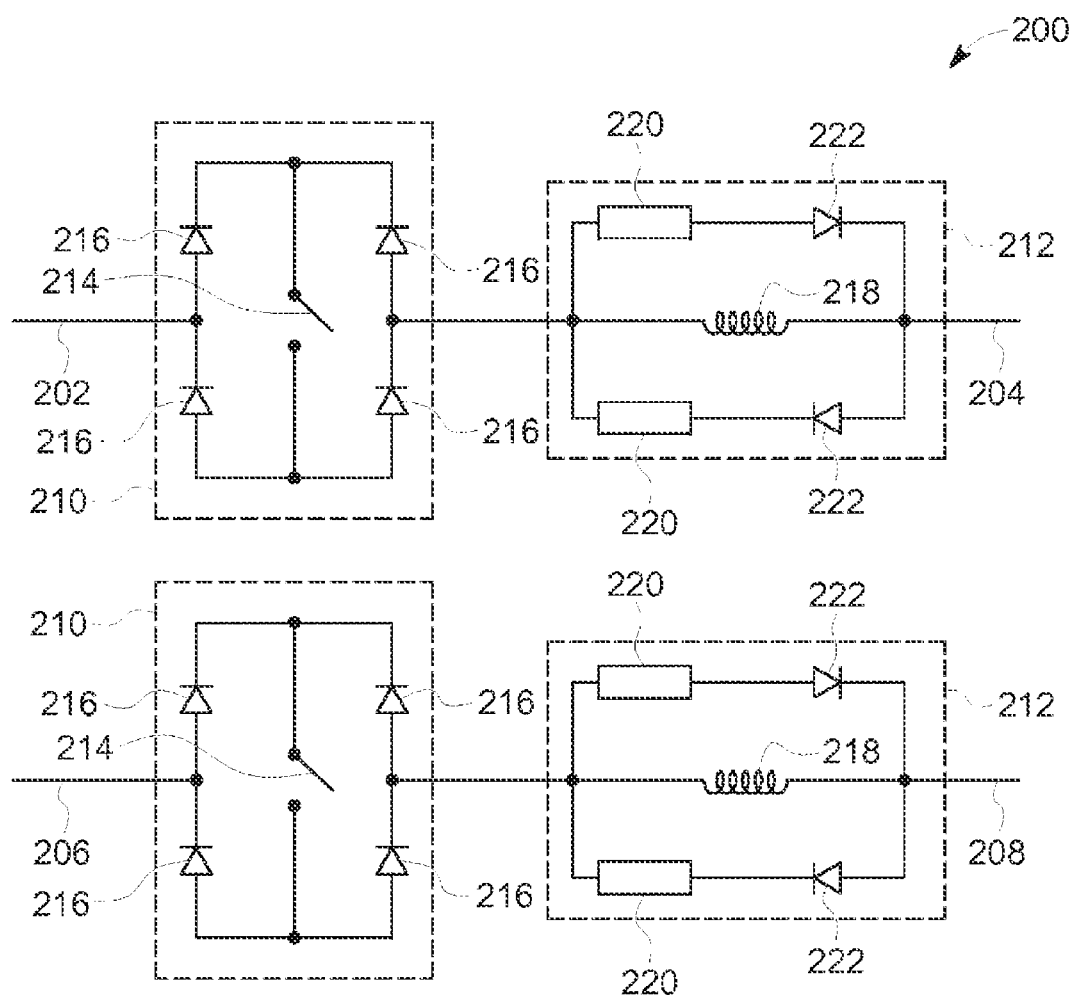
FIG. 2 is a schematic diagram of an exemplary protection tie for use in the DC power distribution system shown in FIG. 1.

FIG. 2 is a schematic diagram of an exemplary protection tie 200 for use in DC power distribution system 100 (shown in FIG. 1). Protection tie 200 is coupled between a source-side positive DC bus 202 and a load-side positive DC bus 204, and also between a source-side negative DC bus 206 and a load-side negative DC bus 208. Protection tie 200 includes switch assemblies 210 and protection assemblies 212.

Each of switch assemblies 210 includes a switch 214 and diodes 216. For a given current direction, current passes through switch 214 and like-polarity diodes with respect to the current source, which is either source-side or load side. Each of protection assemblies 212 is a passive protection assembly and includes an inductor 218, and impedances 220, and diodes 222. Inductors 218 are coupled in-line with load-side positive DC bus 204 and load-side negative DC bus 208, and are further coupled in parallel with series-coupled diodes 222 and impedances 220.

During normal operation, switches 214 are closed and, for both load-side positive DC bus 204 and load-side negative DC bus 208, current flows through inductor 218 and through switch assembly 210. Diodes 222 and impedances 220 maintain a higher impedance than inductor 218, causing most of the current to pass through inductor 218. During a fault condition near switch assemblies 210, such as, for example, near load 116 (shown in FIG. 1), current in switch assemblies 210 increases beyond a predefined limit in magnitude within a certain time period. Generally, a power source, such as, for example, power source 102 (shown in FIG. 1), coupled to source-side positive DC bus 202 and source-side negative DC bus 206 includes current sensing and monitoring circuits that detect the fault and cause switches 214 of switch assemblies 210 to open. When such a fault occurs, the current typically spikes higher in the nearer of switch assemblies 210, which is typically switch assemblies 210 for the protection tie 200 for that particular power source. Further, during a fault condition, inductor 218 presents an impedance to the current from other power sources and other protection ties. The protection ties on the other power sources limit current sourced by those power sources to prevent them from feeding the fault.

During opening of switches 214, energy stored in inductors 218 will be free-wheeled through one of diodes 222, which are arranged in antiparallel. One of diodes 222 is forward biased based on the direction of the current through protection assemblies 212. The free-wheeling energy is dissipated in the corresponding resistor of resistors 220. When switches 214 are opened successfully, the fault near switch assemblies 210 can be physically isolated and galvanically isolated from the ring bus. Isolation, in certain embodiments, may also include a slow acting DC isolator switch or a breaker, such as, for example, circuit breaker 118 (shown in FIG. 1). During a fault, the frequency is momentarily non-zero, causing inductor 218 to divert current through diodes 222 and impedances 220, which dissipates the current.

Inductor 218 limits the rate of change of the current. The inductance value of inductor 218 is chosen to limit the current change to as small as possible. An additional consideration is that, generally, the faster switch assembly 210 operates, the smaller inductor 218 can be to sufficiently limit current through protection tie 200.

Figure 3:
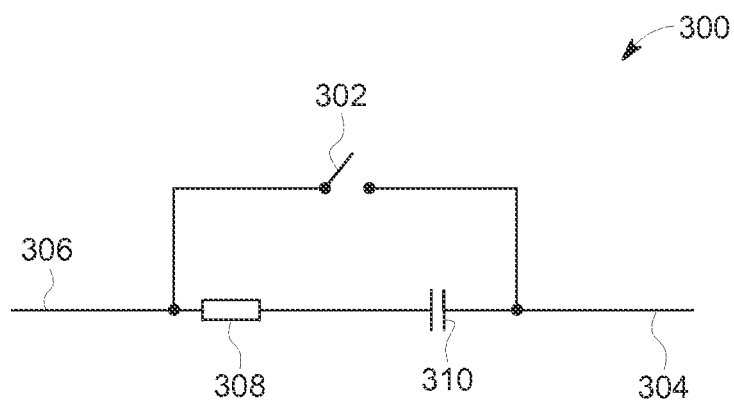
FIG. 3 is a schematic diagram of another exemplary switch assembly for use in the DC power distribution system shown in FIG. 1 and the protection tie shown in FIG. 2.

FIG. 3 is schematic diagram of another exemplary switch assembly 300 for use in DC power distribution system 100 (shown in FIG. 1) and protection tie 200 (shown in FIG. 2). Switch assembly 300 includes a switch 302 coupled between a line side 304 and a load side 306. A resistor 308 and a capacitor 310 are serially coupled, forming an RC circuit, and further coupled in parallel to switch 302.

During normal operation, switch 302 is closed and current flows from line terminal 304 to load terminal 306. The RC circuit formed by resistor 308 and capacitor 310 is high impedance relative to switch 302. Switch 302 is embodied in any switch that is functional as a disconnect, including, for example, and without limitation, mechanical switches and semiconductor switches. Semiconductor switches generally have an advantage over mechanical switches in that semiconductor switches are typically much faster in operation than mechanical switches.

When a fault occurs at a power source protected by switch assembly 300, switch 302 is opened, causing a change in the current through switch assembly 300. The change in current causes capacitor 310 to charge according to the voltage across switch 302 and the time constant associated with the RC circuit formed by resistor 308 and capacitor 310. This relieves high-voltage stress on switch 302. Resistor 308 and capacitor 310 are still a high impedance as seen by other power sources.

Figure 4:
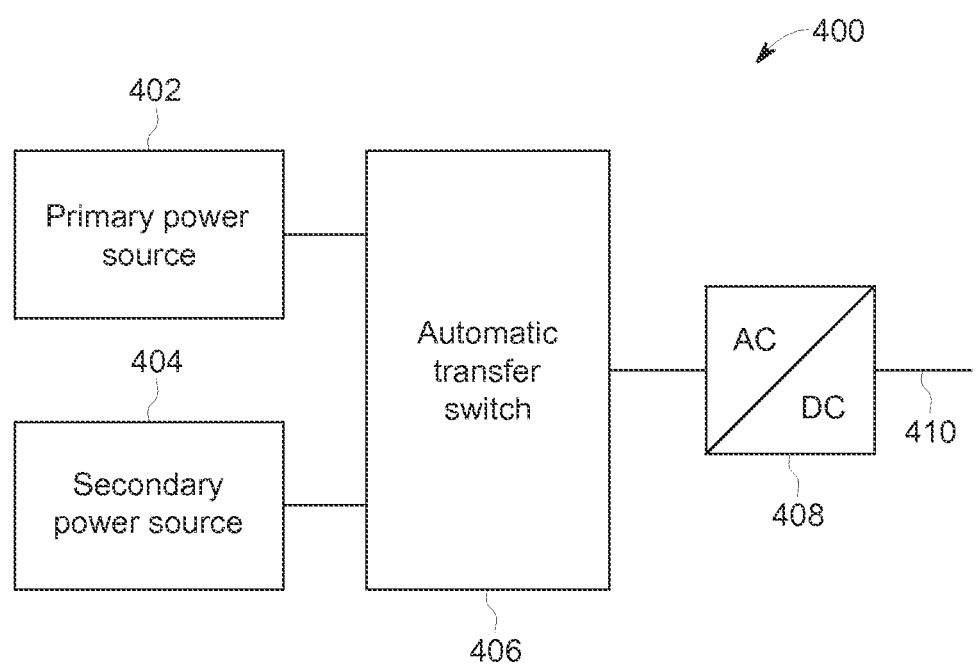
FIG. 4 is a schematic diagram of an exemplary power source for use in the DC power distribution system shown in FIG. 1.

FIG. 4 is a schematic diagram of an exemplary power source 400 for use in DC power distribution system 100 (shown in FIG. 1). Power source 400 includes a primary power source 402 and a secondary power source 404. Primary power source 402 and secondary power source 404 are coupled to an automatic transfer switch 406 that is further coupled to a rectifier 408. Rectifier 408 is then coupled to a DC bus 410.

Automatic transfer switch 406 detects whether primary power source 402 is supplying power. When primary power source 402 is supplying power, automatic transfer switch 406 couples primary power source 402 to rectifier 408. When primary power source 402 is not supplying power, automatic transfer switch 406 decouples primary power source 402 and couples secondary power source 404 to rectifier 408 in its place. Supplied AC power arrives at rectifier 408, which converts it to a DC power that is put onto DC bus 410.

Primary power source 402 and secondary power source 404 include, for example, and without limitation, an electric grid, generator, photovoltaic, wind farm, hydro-electric, or any other suitable electric power source.

Embodiments of the present disclosure relate to electrical power distribution systems.

The above described DC power distribution systems facilitate power sharing among multiple energy sources and, more specifically, a DC ring bus architecture with improved fault isolation. DC protection systems described herein provide passive component fault protection that provides greater reliability to the DC power distribution system as a whole. More specifically, the DC protection systems utilize semiconductor switches and passive components in combination to limit current and reduce high-voltage stress on the circuit. The improved power availability and reliability of the DC ring bus and DC protection systems reduce life-cycle costs of the DC power distribution system.

An exemplary technical effect of the methods, systems, and apparatus described herein includes at least one of: (a) power sharing among multiple energy sources; (b) improved power availability to loads as a result of multiple energy sources; (c) improved load-side fault isolation; (d) improved distribution system reliability as a result of load-side fault isolation; (e) passive component protection scheme yielding improved reliability; and (f) reduced operational cost due to reliability improvements.

Exemplary embodiments of methods, systems, and apparatus for electrical power distribution systems are not limited to the specific embodiments described herein, but rather, components of systems and/or steps of the methods may be utilized independently and separately from other components and/or steps described herein. For example, the methods may also be used in combination with other non-conventional electrical power distribution systems, and are not limited to practice with only the systems and methods as described herein. Rather, the exemplary embodiment can be implemented and utilized in connection with many other applications, equipment, and systems that may benefit from increased efficiency, reduced operational cost, and reduced capital expenditure.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A direct current (DC) power distribution system comprising:
    a plurality of DC power sources;
    a ring bus;
    a plurality of switch assemblies; and
    a plurality of passive protection assemblies, each DC power source of said plurality of DC power sources coupled to said ring bus by a respective switch assembly of the plurality of switch assemblies and a respective passive protection assembly of the plurality of passive protection assemblies.

2. A DC power distribution system in accordance with claim 1, wherein each said respective switch assembly comprises a bidirectional switch.

3. A DC power distribution system in accordance with claim 2, wherein each said respective switch assembly comprises an RC assembly comprising a resistor connected in series with a capacitor, said RC assembly coupled in parallel with said bidirectional switch.

4. A DC power distribution system in accordance with claim 2, wherein said bidirectional switch comprises one of a reverse blocking insulated gate bipolar transistor (IGBT), a pair of IGBTs, and four diodes coupled to a switch.

5. A DC power distribution system in accordance with claim 2, wherein each said respective passive protection assembly comprises an inductor.

6. A DC power distribution system in accordance with claim 5, wherein each said respective passive protection assembly comprises a first branch comprising said inductor, a second branch coupled in parallel with said first branch, and a third branch coupled in parallel with said first branch, said first branch and said second branch each comprising a diode coupled in series with a branch resistance.

7. A DC power distribution system in accordance with claim 6, wherein said branch resistance comprises a discrete resistor.

8. A DC power distribution system in accordance with claim 6, wherein said first branch is connected antiparallel with said second branch.

9. A protection system for connection between a power source and a direct current (DC) ring bus comprising:
    a passive protection assembly comprising:
        a first branch comprising a first end and a second end, said first branch including an inductor coupled between said first end and said second end of said first branch;
        a second branch comprising a first end and a second end, said second branch comprising a diode in series with a resistance coupled between said first end and said second end of said second branch; and
        a third branch having a first end and a second end, said third branch comprising a diode in series with a resistance coupled between said first end and second end of said third branch, said first ends of said first branch, said second branch, and said third branch coupled together and said second ends of said first branch, said second branch and third branch coupled together.

10. A protection system in accordance with claim 9, wherein said resistance of said second branch and said third branch comprise discrete resistors.

11. A protection system in accordance with claim 9, wherein:
    said second branch diode comprises an anode and a cathode, and said second branch diode is positioned with said anode closer to said first end of said second branch than said second end of said second branch; and
    said third branch diode comprises an anode and a cathode, and said third branch diode is positioned with said cathode closer to said first end of said third branch than said second end of said third branch.

12. A protection system in accordance with claim 9, further comprising a switch assembly coupled to said passive protection assembly.

13. A protection system in accordance with claim 12, wherein said switch assembly comprises a bidirectional switch coupled in parallel with an RC assembly comprising a resistor coupled in series with a capacitor, said RC assembly coupled in parallel with said bidirectional switch.

14. A protection system in accordance with claim 13, wherein said bidirectional switch comprises one of a reverse blocking insulated gate bipolar transistor (IGBT), a pair of IGBTs, and four diodes coupled to a switch.

15. A direct current (DC) power distribution system comprising:
   a first distribution bus configured to provide DC power, said first distribution bus comprising a first switch assembly and a first passive protection assembly;
   a second distribution bus configured to provide DC power, said second distribution bus comprising a second switch assembly and a second passive protection assembly; and
   a ring bus connecting said first distribution bus and said second distribution bus.

16. A DC power distribution system in accordance with claim 15, further comprising:
   a first alternating current (AC) to DC power converter comprising an input coupled to a first AC power source and an output coupled to said first distribution bus; and
   a second AC to DC power converter comprising an input coupled to a second AC power source and an output coupled to said second distribution bus.

17. A DC power distribution system in accordance with claim 16, further comprising:
   a first switch configured to selectively connect at least one of the first AC power source and a third AC power source to said first AC to DC power converter; and
   a second switch configured to selectively connect at least one of the second AC power source and a fourth AC power source to said second AC to DC power converter.

18. A DC power distribution system in accordance with claim 15, wherein said first distribution bus and said second distribution bus are connected to provide DC power to a same load.

19. A DC power distribution system in accordance with claim 15, wherein
   said first switch assembly and said second switch assembly each comprise a bidirectional switch coupled in parallel with an RC assembly including a resistor coupled in series with a capacitor.

20. A DC power distribution system in accordance with claim 15, wherein said first passive protection assembly and said second passive protection assembly each comprise a first branch comprising said inductor, a second branch coupled in parallel with said first branch, and a third branch coupled in parallel with said first branch, said first branch and said second branch each comprising a diode coupled in series with a resistor.

* * * * *